United States Patent
Walk et al.

(10) Patent No.: US 6,614,005 B1
(45) Date of Patent: Sep. 2, 2003

(54) DEVICE AND METHOD FOR THERMALLY TREATING SUBSTRATES

(75) Inventors: Heinrich Walk, Allmendingen (DE); Roland Mader, Kempten (DE); Werner Blersch, Bussmannshausen (DE); Markus Hauf, Ichenhausen (DE)

(73) Assignee: STEAG RTP Systems GmbH (DE)

( * ) Notice: Subject to any disclaimer, the term of this patent is extended or adjusted under 35 U.S.C. 154(b) by 0 days.

(21) Appl. No.: 09/979,646
(22) PCT Filed: Apr. 22, 2000
(86) PCT No.: PCT/EP00/03665
§ 371 (c)(1), (2), (4) Date: Dec. 13, 2001
(87) PCT Pub. No.: WO00/72636
PCT Pub. Date: Nov. 30, 2000

(30) Foreign Application Priority Data

May 21, 1999 (DE) .......................... 199 23 400

(51) Int. Cl.$^7$ .................................. F27B 5/14
(52) U.S. Cl. ............. 219/390; 219/405; 219/411; 392/416; 392/418; 118/724; 250/492.2
(58) Field of Search ..................... 219/390, 405, 219/411; 118/724, 725, 50.1; 392/416, 418; 250/492.2

(56) References Cited

U.S. PATENT DOCUMENTS

| 4,398,094 A | | 8/1983 | Hiramoto |
| 4,550,684 A | * | 11/1985 | Mahawili .................. 118/724 |
| 4,698,486 A | | 10/1987 | Sheets |
| 4,820,906 A | * | 4/1989 | Stultz ....................... 219/405 |
| 5,180,226 A | * | 1/1993 | Moslehi ..................... 374/127 |
| 5,336,641 A | | 8/1994 | Fair et al. |
| 5,577,157 A | * | 11/1996 | Sopori ....................... 392/416 |
| 5,861,609 A | * | 1/1999 | Kaltenbrunner et al. .... 219/390 |
| 6,122,440 A | * | 9/2000 | Campbell ................... 392/420 |
| 6,252,203 B1 | * | 6/2001 | Zapata et al. ............... 219/405 |

FOREIGN PATENT DOCUMENTS

| DE | 36 34 131 | 3/1987 |
| DE | 295950 | 11/1991 |
| EP | 0468874 A2 | 1/1992 |
| JP | 11003868 | 1/1999 |
| JP | 11008204 | 1/1999 |
| WO | WO 00/14775 | 3/2000 |

* cited by examiner

Primary Examiner—Teresa Walberg
Assistant Examiner—Shawntina Fuqua
(74) Attorney, Agent, or Firm—R W Becker & Associates; R W Becker

(57) ABSTRACT

The aim of the invention is to provide an economical and homogenous thermal treatment for substrate. To this end, the inventive device and method for thermally treating substrates, especially semiconductor wafers, comprise at least one heating device for heating at least one substrate by electromagnetic radiation. Said heating device comprises at least two arc lamps, the radiation characteristics for each arc lamp being controlled individually, and the electromagnetic radiation of the arc lamps contributing essentially to the power density of the electromagnetic radiation of the heating device.

39 Claims, 2 Drawing Sheets

DEVICE AND METHOD FOR THERMALLY TREATING SUBSTRATES

BACKGROUND OF THE INVENTION

The present invention relates to an apparatus and a method for the thermal treatment of substrates, especially semiconductor wafers, including at least one heating device for heating at least one substrate by means of electromagnetic radiation, whereby the heating device includes at least two arc lamps.

An apparatus of the aforementioned type is known, for example, from U.S. Pat. No. 4,698,486, according to which a semiconductor wafer that is located in a reaction chamber is initially heated by an arrangement of quartz halogen lamps. After the wafer has reached a certain temperature, an additional lamp arrangement, namely a high-power pulsed lamp arrangement, is used for heating the wafer. The pulsed lamp arrangement is used only for a short period of time, whereby the surface temperature of the wafer is raised to a temperature in the vicinity of the melting point of the semiconductor material. Due to the short periods of use of the pulsed lamps, the temperature of the wafer is influenced by the pulsed lamps only in the region of the wafer surface, which leads to a non-homogeneous temperature distribution over the thickness of the wafer. The quartz halogen lamps, as well as the pulsed lamps, are disposed in a highly reflective chamber that surrounds the reaction chamber and that is built up in the form of a kaleidoscope. In order to achieve a homogeneous temperature distribution on the surface of the wafer in the reaction chamber, it is important with this known apparatus that the spacing between the respective lamps and the surface of the wafer be greater than or at least equal to the diameter of the reflective chamber. The spacing between the respective lamps and the wafer surface, in particular with an apparatus that is suitable for heating both sides of the wafer, leads to a large overall size of the apparatus. With the ever increasing wafer diameters, such as for example 300 mm wafers, it is therefore necessary to have a very large reflective chamber, which leads to high manufacturing and maintenance costs of the apparatus.

From U.S. Pat. No. 4,398,094 as well as U.S. Pat. No. 5,336,641 respective apparatus are known for the thermal treatment of semiconductor wafers, according to which in each case an individual arc lamp having a mirror is used as the heat source. The arc lamps used as the heat source are thereby generally high-power arc lamps having an expensive construction and a complicated cooling device. Due to the use of an individual lamp, it is not possible to achieve a homogeneous thermal treatment of the wafer.

From DD-A-295950 it is furthermore known to use UV radiating systems having varying configurations in combination with glow lamps for the thermal treatment of semiconductor wafers. In this connection, a metallic vapor, low-pressure UV source is used that contributes only insignificantly to the overall radiation density of the heating device. The object of the UV radiation system is not the actual heating of the wafer, but rather the promotion of photochemical reactions in conjunction with thermally activated processes via the UV irradiation.

Most of the presently commercially available apparatus for the thermal treatment of substrates utilize exclusively glow lamps for the thermal treatment of semiconductor wafers. However, these lamps have the drawback that the radiation of the glow lamps is only very slightly absorbed at wafer temperatures below 600° C. This is due to the characteristic spectrum of the glow lamps, which at wave lengths of about 1000 nm is at its maximum. The rate of absorption of an Si semiconductor substrate is, however, for wave lengths in this range greatly dependent upon temperature and varies from about 0.1 to 0.7. Only at temperatures of more than 600° C. is the rate of absorption in this wave length range nearly independent of wave length. The result of this is that the energy of the glow lamps can be effectively absorbed only at a wafer temperature of greater than about 600° C.

Proceeding from the known apparatus, it is an object of the present invention to provide an apparatus of the aforementioned type that enables an effective economical and homogeneous thermal treatment of substrates.

SUMMARY OF THE INVENTION

Pursuant to the present invention, this object is realized with an apparatus of the aforementioned type in that the radiation characteristics for each arc lamp can be individually controlled by a control device, and in that the electromagnetic radiation of the arc lamps contribute substantially to the power density of the electromagnetic radiation of the heating device. The use of arc lamps, which contribute significantly to the power density of the electromagnetic radiation of the heating device, has the advantage that these lamps radiate in a spectral range in which, for example Si wafers, have the highest absorption, and in particular already at room temperature. Thus, as a result of the arc lamps an effective heating in particular of semiconductor wafers is possible even at room temperatures. Due to the possibility of an individual control of the arc lamps, the spatial radiation field of the lamps can be established, which enables a homogeneous radiation distribution and thus a homogeneous temperature distribution upon the wafer surface. Due to the ability to set the spatial radiation field, the heating device, including the arc lamps, can be disposed in the vicinity of the substrate that is to be treated, and it is not necessary to maintain a certain spacing between the heating device and the substrate, which spacing is prescribed by the diameter of the treatment apparatus, in order to be able to carry out a homogeneous substrate treatment. As a result, the overall size of the apparatus, and the cost connected therewith, can be considerably reduced.

For an optimal adaptation of the radiation characteristics of the apparatus to the process conditions, especially to the substrate that is to be treated, the operating mode and/or the lamp current of the arc lamps is advantageously individually controllable. The arc lamps are advantageously controllable in a direct current operation and/or in a pulsed manner as flash or pulsed lamps. For an effective use of the arc lamps, these contribute at least $\frac{1}{10}$ to the power density of the heating device. For a good, effective cooling of the arc lamps, these are preferably fluid cooled. As a result of a good cooling of the arc lamps, their life expectancy can be extended considerably.

In order to achieve a good, homogeneous temperature distribution on the substrate that is to be treated, the gas or glow discharge zone of the arc lamps corresponds essentially to a dimension of the substrate, such as the edge, length or the diameter of the substrate. It is preferably longer than the dimension of the substrate. The arc lamps are preferably disposed in the region of the outer periphery of the substrate in order to be able to easily control the temperature distribution. Arc lamps are particularly suitable in this region, because they have a rapid response characteristic.

The heating device preferably has a bank of lamps having at least two rod-shaped lamps that are disposed nearly parallel to one another. In this connection, the lamps of the bank of lamps have, preferably in addition to the arc lamps, glow lamps that enable an economical heating of the substrates. Pursuant to one specific embodiment of the invention, the glow lamps and the arc lamps have essentially the same dimensions so that they can be interchanged in order to be able to specifically adapt the radiation characteristics within the apparatus to the respective substrate or the respective thermal process. The glow lamps and the arc lamps advantageously have essentially the same lamp power, so that the same cooling system can be utilized for the lamps. For an increased effectiveness of the apparatus, the heating device is surrounded by a chamber that at least in stages reflects the electromagnetic radiation, so that radiation of the lamps that is not directed directly upon the substrate is reflected upon the substrate. In this connection, the spectral reflection coefficient of the chamber is preferably dependent upon position in order to achieve a certain spectral radiation distribution upon the substrate surface. In particular, it is possible to prevent the UV radiation of the arc lamps from being reflected upon certain regions of the substrate that do not face the arc lamps.

In order to reduce the overall size of the apparatus, the spacing of the heating device relative to the surface of the substrate is preferably less than the diameter of a reaction chamber. In this connection, the ratio between spacing and diameter is advantageously less than 0.5.

Pursuant to a particularly preferred specific embodiment of the invention, the radiation characteristics of the electromagnetic radiation of the heating device can be modulated, as a result of which a good possibility of determining the temperature of the wafer is provided. In this connection, it is an advantage of the arc lamps that they can be operated with considerably higher modulation frequencies than is true for halogen lamps. As a result, the temperature of the object, especially during the temperature fluctuations, can be determined more precisely and with simpler evaluation electronics.

The heating device and/or the substrate is advantageously disposed in a nearly homogeneous, adjustable magnetic field, the lines of flux of which, at least in the vicinity of the arc lamp anode have a component that extends essentially parallel to the arc discharge of the arc lamps. A modulation of the lamps can be effected by the magnetic field. Furthermore, by means of the magnetic field a significant influence can be had upon the life expectancy of the arc lamps, since the rate of erosion of the anode can be positively reduced. In this connection, the magnetic flux density of the magnetic field is advantageously between 0.005 and 0.3 tesla.

For a thermal treatment on both sides of the substrate, the apparatus preferably has a second heating device, whereby the substrate is disposed between the heating devices.

The apparatus advantageously has a reaction chamber that essentially surrounds the substrate and is nearly transparent for the electromagnetic radiation of the heating device, the reaction chamber advantageously being provided with quartz glass and/or sapphire. The reaction chamber material advantageously has an absorption coefficient, averaged over the spectrum of the electromagnetic radiation, between 0.001 per centimeter and 0.1 per centimeter. The thickness of the wall of the reaction chamber is preferably between one millimeter and five millimeters.

Pursuant to one preferred specific embodiment of the present invention, the glow lamps at least partially have a helical filament structure with which preferably a predefined geometrical and spectral radiation profile can be achieved. For this purpose, the filament preferably alternatingly has helical and non-helical filament structures. Pursuant to a further, preferred specific embodiment of the invention, at least one glow lamp has at least two individually controllable filaments. Preferably at least one filament of a glow lamp has at least three electrical connections. The density of at least one filament structure preferably varies along the filament.

Pursuant to a preferred specific embodiment of the invention, the reaction chamber and/or the lamp bodies form a frequency filter for at least one wave length range of the electromagnetic radiation of the heating device in order within this spectrum to determine the radiation reflected from the wafer and hence to determine the temperature, whereby the lamp radiation is suppressed by the filter effect. Such a frequency filter can be achieved, for example, in that synthetic quartz is selected for the lamp bulbs and fused quartz is selected for the reaction chamber. The filter effect of such a frequency filter can be additionally influenced by the selection of the temperature of the lamp body. In particular at low temperatures the intrinsic emission of the lamp body is additionally reduced. As a result, approximately at 2700 nm the lamp radiation is suppressed, the wafer radiation of 2700 nm can, however, be detected through the reaction chamber. In general, such frequency filters can be built up as absorption filters or in the form of interference filters, in other words, by utilizing thin dielectric layers. These advantages can also be advantageously achieved in that at least one of the lamps is at least partially filled with a material that absorbs a specific wave length range of the electromagnetic radiation of the heating device. With the halogen lamps, a suitable additive can, for example, be mixed with the halogen gas of the lamp filling, with such additive absorbing in narrow bands and advantageously emitting only slightly or not at all in the absorption band.

The object of the invention can be realized with a method of the aforementioned type in that the radiation characteristics for each arc lamp are individually controlled, and the electromagnetic radiation of the arc lamps contributes substantially to the power density of the electromagnetic radiation of the heating device. This results in the advantages already mentioned above.

Pursuant to a particularly preferred specific embodiment of the invention, the substrate is heated in a lower temperature range essentially by means of the arc lamps, since arc lamps give off radiation in a spectral range that, for example, by SI semiconductor wafers, is absorbed better at temperatures below 600° C. than is the radiation of glow lamps. The substrate is preferably heated in a lower temperature range exclusively by means of arc lamps. For Si semiconductor wafers, the lower temperature range is preferably between room temperature and approximately 600° C.

The electromagnetic radiation of the heating device is preferably modulated, which pursuant to one specific embodiment of the invention is effected by applying a magnetic field in the region of the substrate and/or the heating device, with the lines of flux of the magnetic field, at least in the region of the arc lamp anode, having a component that extends essentially parallel to the arc discharge.

The invention will be explained in greater detail subsequently with the aid of a preferred specific embodiment and with reference to the drawings; the drawings show:

BRIEF DESCRIPTION OF THE DRAWING

FIG. 1 a schematic cross-sectional view of an apparatus for the

DESCRIPTION OF PREFERRED EMBODIMENTS

Figure 1:
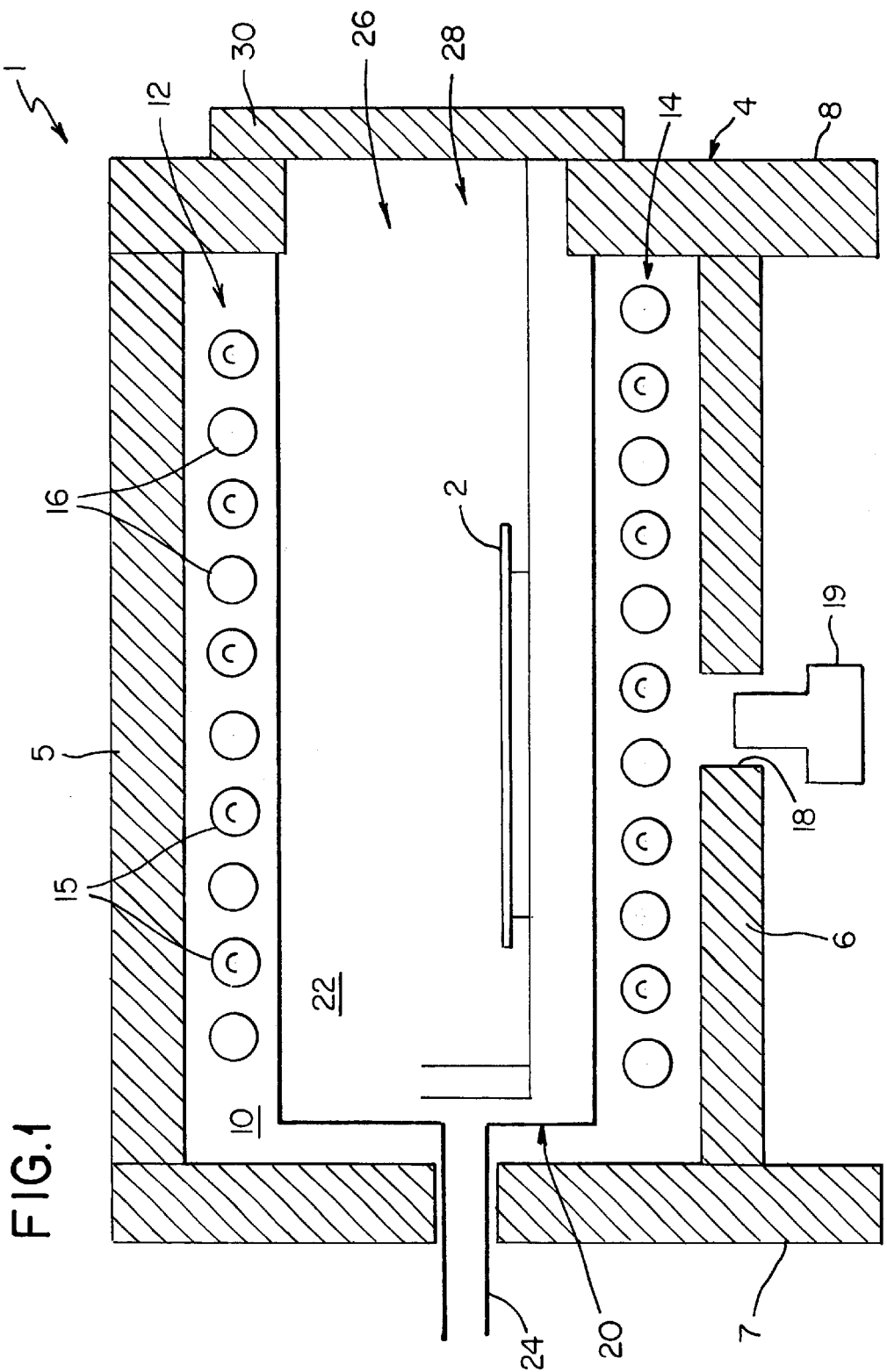

FIG. 1 shows an apparatus 1 for the thermal treatment of semiconductor wafers 2. The apparatus 1 comprises a housing 4 having an upper wall 5, a lower wall 6, a left side wall 7, a right side wall 8, as well as non-illustrated front and rear walls, to form an essentially closed chamber 10. The surfaces of the walls of the housing 4 that face the chamber 10 are coated in a known manner in order to serve as reflector surfaces, or the walls are made of a material that has a high reflectivity.

Provided within the chamber 10, adjacent to the upper wall 5, is a first lamp arrangement 12, and adjacent to the lower wall 6 is a second lamp arrangement 14. The lamp arrangement 12 comprises five arc lamps 15 as well as five halogen lamps 16, whereby the arrangement can, of course, have a different number of lamps. The lamps 15 and 16 are embodied as rod lamps that extend essentially parallel to the upper wall 5 and perpendicular to the plane of the drawing. The lamps 15 and 16 are held in a suitable manner in the non-illustrated front wall and in the non-illustrated rear wall. The dimensions of the arc lamps 15 correspond essentially to the dimensions of the halogen lamps 16 and they are therefore interchangeable.

The gas or glow discharge zone of the arc lamps 15 corresponds to the diameter of the wafer 2 in order to achieve a uniform radiation distribution upon that wafer surface that is to be heated.

The lamps 15 and 16 of the upper lamp arrangement 12 are respectively individually controllable by means of a non-illustrated control device. In this connection, for example, the arc lamps 15 can be controlled with direct current, or they can be controlled in a pulsed manner, so that they operate in a flash mode. In particular, also the lamp current, and hence the intensity of the radiation given off, can be individually controlled for each lamp. By means of this individual ability to control, not only the spatial but also the spectral radiation profile can be precisely established within the chamber 10. In so doing, it is possible to achieve over the wafer surface a homogeneity of the temperature distribution of better than 0.5% with a 300 mm wafer and a temperature of 1000° C. In particular, it is also possible to control the current density of the arc lamps, whereby the UV portion of the radiation greatly increases at high current densities, so that the arc lamps correspond to a radiating system having a temperature between 8000 and 9000° C. In this connection, the emission spectrum of the radiation has a maximum at approximately 350 nm. In this wave length range, the material of the wafer (Si) has a high absorption coefficient that is essentially independent of the temperature of the wafer.

The lower bank of lamps 14 is essentially built up in the same manner from rod-shaped arc lamps and halogen lamps, and will therefore not be described in greater detail. Provided in the lower housing wall 6 is an opening 18 into which a pyrometer 19 is at least partially introduced in order in a known manner to determine the temperature of the wafer 2.

The spacing between the upper and lower banks of lamps 12,14 and the wafer is generally between 1 cm and 10 cm. Depending upon the diameter of the wafer 2 that is to be handled, and hence the diameter of the chamber 10, there results a ratio between the spacing and the diameter which is considerably less than 1.0. The ratio is preferably less than 0.5, and preferably even less than 0.15. With a lamp spacing of 1 cm and a chamber diameter of 50 cm, a ratio of, for example, 0.02 would result.

The radiation of the lamps 15 and 16 is modulated during the operation of the apparatus in order in a known manner to be able to differentiate the radiation of the lamps from the radiation emitted from the wafer. From the radiation emitted from the wafer it is in turn possible to determine the temperature of the wafer. In this connection, arc lamps have the advantage that they can be operated with a higher modulation frequency than can the halogen lamps. As a result, the temperature of the wafer can be determined more precisely and with simpler evaluation electronics, especially during a heating-up phase with in part rapid temperature variations. The modulation can be effected by modulation of the lamp current or with the arc lamps by applying a magnetic field, as will be described in greater detail subsequently.

Provided within the chamber 10, between the upper and lower lamp arrangements 12,14, is a reaction chamber housing 20 for forming a reaction chamber 22 in which the wafer is accommodated and held in a known manner. The reaction chamber housing is comprised of a material, for example quartz glass and/or sapphire, that is nearly transparent for the electromagnetic radiation of the lamps. The reaction chamber housing 20, on its left side pursuant to FIG. 1, has an inlet conduit 24 that extends through the left side wall 7 of the housing 4 and communicates with a non-illustrated supply of gas. By means of the inlet conduit 24, during the thermal treatment of the wafer 2 a gas is introduced into the reaction chamber 22 in order to provide specific process parameters.

On the right side, the reaction chamber housing 20 has an opening 26 that communicates with an opening 28 in the right side wall 8 of the housing 4. The opening 28 is closed off by a door 30 that can be opened for the introduction into and removal of the wafer 2 from the reaction chamber 22.

In the specific embodiment of the invention illustrated in FIG. 1, not only the upper lamp arrangement 12 but also the lower lamp arrangement 14 are provided with arc lamps and halogen lamps. However, when structured wafers are treated, it can be advantageous, for the careful treatment of the structures, if no UV light falls on the structures. To prevent this, pursuant to an alternative, non-illustrated specific embodiment of the invention, for example, the upper bank of lamps 12 has no arc lamps that face the structure of the wafer. Furthermore, the inner walls of the chamber 10 that are disposed above a plane of the wafer are coated with a material, such as gold, that has a very low reflection coefficient for UV light. This prevents UV light from falling directly upon the structure of the wafer, or being reflected thereupon. In contrast, the inner walls of the chamber 10 that are disposed below a plane of the wafer 2 can be coated with a material, such as aluminum, that reflects UV light in order to achieve an efficient irradiation and hence heating of the underside of the wafer, even with UV radiation.

Figure 2:
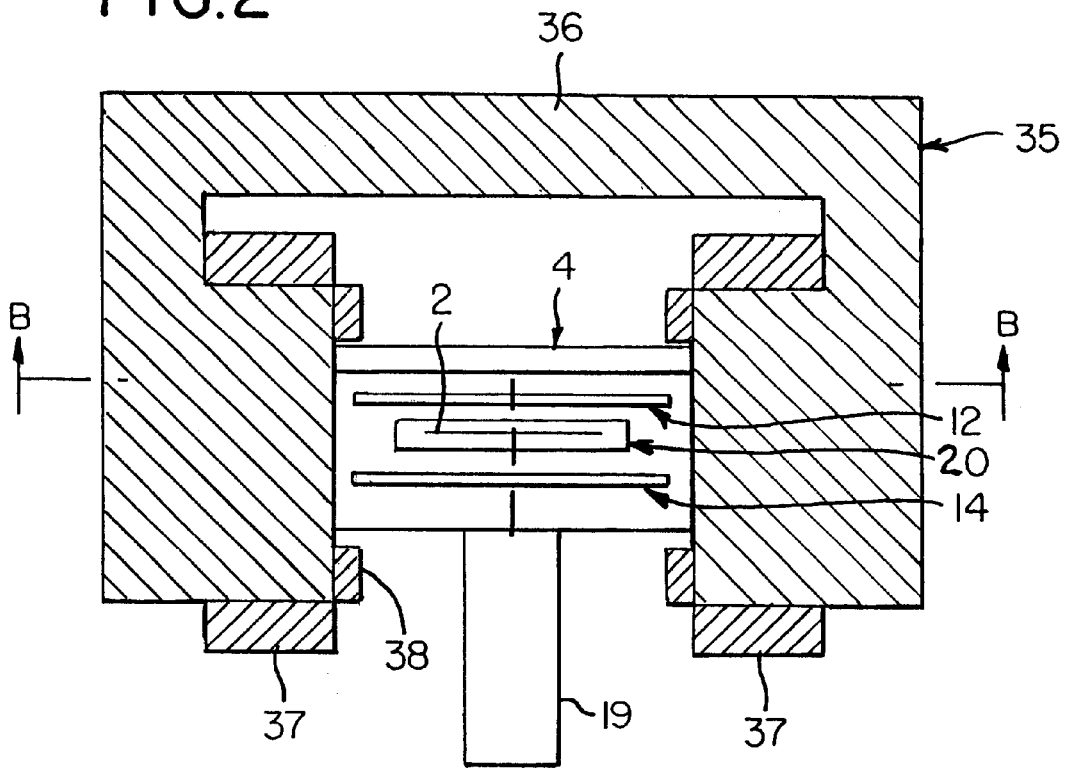
FIG. 2 a schematic cross-sectional view of an alternative specific embodiment taken along the line A—A in FIG. 3.

FIG. 2 shows an alternative specific embodiment of a thermal treatment apparatus for substrates, whereby in FIG. 2 the same reference numerals are used as in FIG. 1 in order to designate the same or equivalent components.

Thus, in essentially the same manner as the apparatus of FIG. 1, the apparatus of FIG. 2 is provided with a housing 4 in which are disposed a reaction chamber housing 20 as well as lamp arrangements 12 and 14.

As can be seen, the section of FIG. 2 extends parallel to the lamp arrangements 12 and 14. The housing 4 is partially surrounded by an electromagnet 35. The electromagnet 35 has a ferromagnetic yoke 36 as well as coils 37 for applying a magnetic field. The yoke 36 and the coils 37 are arranged in such a way that they produce a magnetic field that extends essentially parallel to the lamps of the lamp arrangements 12,14, i.e. essentially parallel to the surface of the wafer. By providing auxiliary coils 38, which are similarly provided on the electromagnet 35, the homogeneity of the magnetic field can be set. By means of the magnetic field produced by the electromagnet 35, the geometrical and spectral radiation characteristics of the arc lamps contained in the lamp arrangements 12 and 14 can be established. Furthermore, by means of the magnetic field the life expectancy of the arc lamps can be extended. By modulating the magnetic field, the radiation intensity of the arc lamps can furthermore be modulated, which makes it possible for the pyrometer 19 to determine the wafer temperature.

Instead of, or also in conjunction with the modulation of the lamp radiation, there is also the possibility of providing a frequency filter for at least one wave length range of the electromagnetic radiation of the lamps. This results in an alternative differentiation, at least in one frequency range, between the radiation emitted from the wafer and the radiation emitted from the lamps. This in turn enables a temperature determination of the wafer. In this connection, for example, the lamp bodies and/or the reaction chamber could form a frequency filter. The filter effect can, for example, be achieved by using synthetic quartz for the lamp bodies and using fused quartz for the reaction chamber. The synthetic quartz suppresses the lamp radiation at about 2700 nm whereas the fused quartz allows the radiation emitted by the wafer in this wave length range to pass through, so that the radiation in this wave length range is detected by the pyrometer and can be used for determining the temperature of the wafer. Such frequency filters can be produced as absorption filters or in the form of interference filters, i.e. by providing thin dielectric layers.

In addition, especially with halogen lamps, there is the possibility of mixing the gas of the lamp filling with a suitable additive that absorbs in a narrow band and in the absorption band emits slightly or even not at all.

Figure 3:
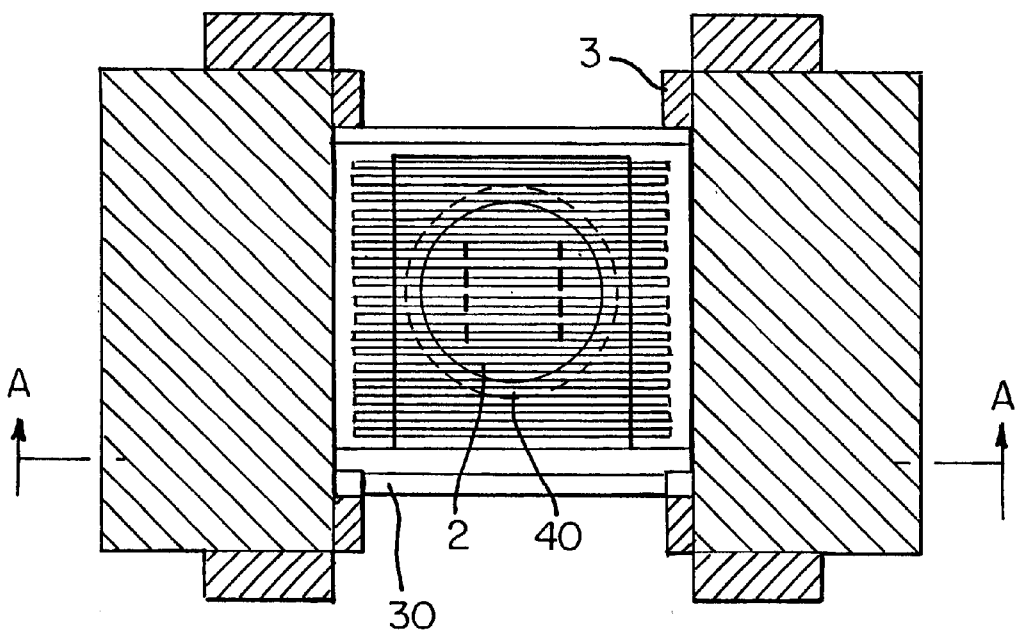
FIG. 3 a schematic cross-sectional view of the specific embodiment of FIG. 2 taken along the line B—B in FIG. 2.

FIG. 3 shows a cross-sectional view of the apparatus of FIG. 2 along the line B—B, whereby in this view one can see a compensation ring 40 that surrounds the wafer 2.

Although the apparatus has been described with the aid of preferred specific embodiments, it should be noted that the invention is not limited to these embodiments. In particular, for example, an apparatus is possible that is provided exclusively with individually controllable arc lamps within the lamp arrangements 12 and 14. Of course, arc lamps can also be used with other than the described halogen lamps within the lamp arrangements. Furthermore, it is also not necessary to provide two separate lamp arrangements 12,14 since under certain circumstances a single lamp arrangement, such as the lamp arrangement 12 would also be adequate for the thermal treatment of the semiconductor wafer 2. Certain of the aforementioned features, such as the provision of frequency filters or the mixing of a gas that absorbs in a narrow band to the lamp filling of heating lamps are independent of the use of certain types of lamps, and in particular are independent of the use of arc lamps.

The specification incorporates by reference the disclosure of German priority document 199 23 400.0 filed May 21, 1999, and International Application PCT/EP00/03665 filed Apr. 22, 2000.

The present invention is, of course, in no way restricted to the specific disclosure of the specification and drawings, but also encompasses any modifications within the scope of the appended claims.

What is claimed is:

1. An apparatus for thermally treating substrates comprising:
   at least one heating device for heating at least one substrate by means of electromagnetic radiation, wherein said at least one heating device includes at least two arc lamps, each of which has a radiation characteristic, wherein electromagnetic radiation of said arc lamps contributes at least $1/10$ to a power density of the electromagnetic radiation of said at least one heating device; and
   a control device for individually controlling the radiation characteristic for each of said arc lamps.

2. An apparatus according to claim 1, wherein at least one of an operating mode and a lamp current are individually controllable.

3. An apparatus according to claim 1, wherein said arc lamps are controllable in direct current operation or in a pulsed manner as flash lamps.

4. An apparatus according to claim 1, where said arc lamps are fluid cooled.

5. An apparatus according to claim 1, wherein a gas discharge zone of said arc lamps essentially corresponds to a dimension of a substrate or is longer than a dimension of said substrate.

6. An apparatus according to claim 1, wherein said arc lamps are disposed in a region of an outer periphery of a substrate.

7. An apparatus according to claim 1, wherein said at least one heating device is provided with a bank of lamps having at least two rod-shaped lamps that are disposed nearly parallel to one another.

8. An apparatus according to claim 7, wherein said lamps of said bank of lamps is provided with glow lamps.

9. An apparatus according to claim 8, wherein said glow lamps and said arc lamps have essentially the same dimensions.

10. An apparatus according to claim 8, wherein said glow lamps and said arc lamps have essentially the same lamp power.

11. An apparatus according to claim 1, wherein said at least one heating device is surrounded by a chamber that at least in stages reflects electromagnetic radiation.

12. An apparatus according to claim 11, wherein a spectral reflection coefficient of said chamber is dependent upon position.

13. An apparatus according to claim 1, wherein a spacing of said at least one heating device from a surface of a substrate is less than a diameter of a reaction chamber in which said substrate is disposed.

14. An apparatus according to claim 13, wherein the ratio between said spacing and said diameter is less than 0.5.

15. An apparatus according to claim 1, which includes means for modulating the radiation characteristics of the electromagnetic radiation of said at least one heating device.

16. An apparatus according to claim 1, wherein at least one of said at least one heating device and a substrate is disposed in a nearly homogeneous, adjustable magnetic field having lines of flux that, at least in the vicinity of an arc lamp anode, have a component that extends essentially parallel to an arc discharge of said arc lamps.

17. An apparatus according to claim 16, wherein a magnetic flux density of said magnetic field is between 0.005 and 0.3 tesla.

18. An apparatus according to claim 1, wherein at least one second heating device is provided, and wherein a substrate is disposed between said at least one heating device and said at least one second heating device.

19. An apparatus according to claim 1, which includes a reaction chamber that essentially surrounds the substrate and is nearly transparent for the electromagnetic radiation of said at least one heating device.

20. An apparatus according to claim 19, wherein said reaction chamber is provided with at least one of quartz glass and sapphire.

21. An apparatus according to claim 19, wherein material of said reaction chamber has an absorption coefficient between 0.001 per cm and 0.1 per cm, averaged over the spectrum of the electromagnetic radiation.

22. An apparatus according to claim 19, wherein said reaction chamber has a wall thickness of between 1 mm and 5 cm.

23. An apparatus according to claim 8, wherein said glow lamps are provided at least in part with a helical filament structure.

24. An apparatus according to claim 8, wherein said glow lamps have a filament structure for achieving a predefined geometrical and spectral radiation profile.

25. An apparatus according to claim 8, wherein said glow lamps have respective filaments that have alternating helical and non-helical structures.

26. An apparatus according to claim 8, wherein at least one of said glow lamps has at least two individually controllable filaments, and/or at least one filament of one of said glow lamps has at least three electrical connections.

27. An apparatus according to claim 8, wherein said lamps have a filament structure, and wherein the thickness of at least one of said filament structures varies along a filament.

28. An apparatus according to claim 8, wherein said glow lamps are halogen lamps.

29. An apparatus according to claim 1, wherein at least one of a reaction chamber for a substrate and bodies of said lamps form a frequency filter for at least one wave length range of the electromagnetic radiation of said at least one heating device.

30. An apparatus according to claim 8, wherein at least one of said lamps is filled at least partially with a material that absorbs a specific wave length range of the electromagnetic radiation of said at least one heating device.

31. An apparatus according to claim 30, wherein said material is essentially non-emitting in the absorption range.

32. A method for thermally treating substrates with at least one heating device for heating at least one substrate by means of electromagnetic radiation, wherein said at least one heating device includes at least two arc lamps, said method including the steps of:

individually controlling a radiation characteristic for each of said arc lamps, and having electromagnetic radiation of said arc lamps contribute at least $1/10$ to a power density of the electromagnetic radiation of said at least one heating device.

33. A method according to claim 32, wherein an operating mode and/or a lamp current of said arc lamps is individually controlled.

34. A method according to claim 32, wherein said arc lamps are controlled in direct current operation or in a pulsed manner in a flash operation.

35. A method according to claim 32, wherein a substrate is heated by means of glow lamps.

36. A method according to claim 32, wherein a substrate, in a lower temperature range, is heated essentially by means of said arc lamps or is heated exclusively by means of said arc lamps.

37. A method according to claim 36, wherein said lower temperature range is between room temperature and approximately 600° C.

38. A method according to claim 32, wherein the electromagnetic radiation of said at least one heating device is modulated.

39. A method according to claim 32, wherein a magnetic field is applied in the region of at least one of a substrate and said at least one heating device, and wherein lines of flux of said magnetic field, at least in the region of an arc lamp anode, have a component that extends essentially parallel to an arc discharge.

* * * * *

UNITED STATES PATENT AND TRADEMARK OFFICE
CERTIFICATE OF CORRECTION

PATENT NO. : 6,614,005 B1
DATED : September 2, 2003
INVENTOR(S) : Walk et al.

It is certified that error appears in the above-identified patent and that said Letters Patent is hereby corrected as shown below:

Title page,
Item [54], Title, should read as follows:

-- [54] APPARATUS AND METHOD FOR THE THERMAL TREATMENT OF SUBSTRATES --

Signed and Sealed this

Twenty-third Day of December, 2003

JAMES E. ROGAN
*Director of the United States Patent and Trademark Office*